(12) United States Patent
Masuko et al.

(10) Patent No.: US 7,528,522 B2
(45) Date of Patent: May 5, 2009

(54) SURFACE ACOUSTIC WAVE DEVICE, PACKAGE FOR THE DEVICE, AND METHOD OF FABRICATING THE DEVICE

(75) Inventors: Shingo Masuko, Kawasaki (JP); Naoyuki Mishima, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 10 days.

(21) Appl. No.: 10/883,847

(22) Filed: Jul. 6, 2004

(65) Prior Publication Data
US 2005/0006987 A1     Jan. 13, 2005

(30) Foreign Application Priority Data
Jul. 7, 2003    (JP)    ............................. 2003-193152

(51) Int. Cl.
*H01L 41/08* (2006.01)

(52) U.S. Cl. ............................. 310/313 A; 310/313 R; 310/313 B (58) Field of Classification Search ............ 310/313 R, 310/331 A, 331 B, 348, 313 A, 313 B, 340, 310/364, 363; *H01L 41/08*
See application file for complete search history.

(56) References Cited

U.S. PATENT DOCUMENTS

| 5,430,345 | A | * | 7/1995 | Takahashi | 310/348 |
| 5,506,463 | A | * | 4/1996 | Yoshimoto et al. | 310/344 |
| 5,801,474 | A | * | 9/1998 | Sakairi | 310/313 R |
| 6,528,924 | B1 | * | 3/2003 | Stelzl et al. | 310/313 R |
| 6,798,121 | B2 | * | 9/2004 | Nakatani et al. | 310/313 R |
| 2002/0140322 | A1 | * | 10/2002 | Suga et al. | 310/348 |
| 2003/0112986 | A1 | | 6/2003 | Furukawa | |

FOREIGN PATENT DOCUMENTS

| JP | 11-214955 A | 6/1999 |
| JP | 2001-176995 | 6/2001 |
| JP | 2004-135193 A | 4/2004 |
| WO | WO 02/05424 A1 | 1/2002 |

* cited by examiner

*Primary Examiner*—Thomas M Dougherty
*Assistant Examiner*—Karen B Addison
(74) *Attorney, Agent, or Firm*—Arent Fox LLP (57) ABSTRACT

A surface acoustic wave device includes a package having a cavity, a SAW chip housed in the cavity, a resin sealing the cavity, and a metal thin film provided on the resin.

10 Claims, 6 Drawing Sheets

SURFACE ACOUSTIC WAVE DEVICE, PACKAGE FOR THE DEVICE, AND METHOD OF FABRICATING THE DEVICE

BACKGROUND OF THE INVENTION

1. Field of the Invention

The present invention generally relates to a surface acoustic wave device, a package for the device, and a method of fabricating the device.

2. Description of the Related Art

As electronic apparatuses with higher performances have become smaller in size, electronic devices to be mounted to such apparatuses are also expected to be smaller and have higher performances. Especially, surface acoustic wave (SAW) devices to be used as electronic parts such as filters, delay lines, and oscillators for electronic apparatuses that transmit or receive electric waves have been required to have downsized packages and high performance.

The conventional SAW device has a SAW chip, which is hermetically sealed in a cavity. The SAW chip has a piezoelectric substrate on which interdigital transducers (hereinafter referred to as IDT) having comb-like electrodes are formed. This type of the SAW device is described in, for example, Japanese Patent Application Publication 2001-176995. The IDT on the input side converts an electric signal applied thereto into a SAW, which propagates on the piezoelectric substrate. The IDT on the output side converts the received SAW into an electric signal that has been subjected to a given modulation.

Figure 1:
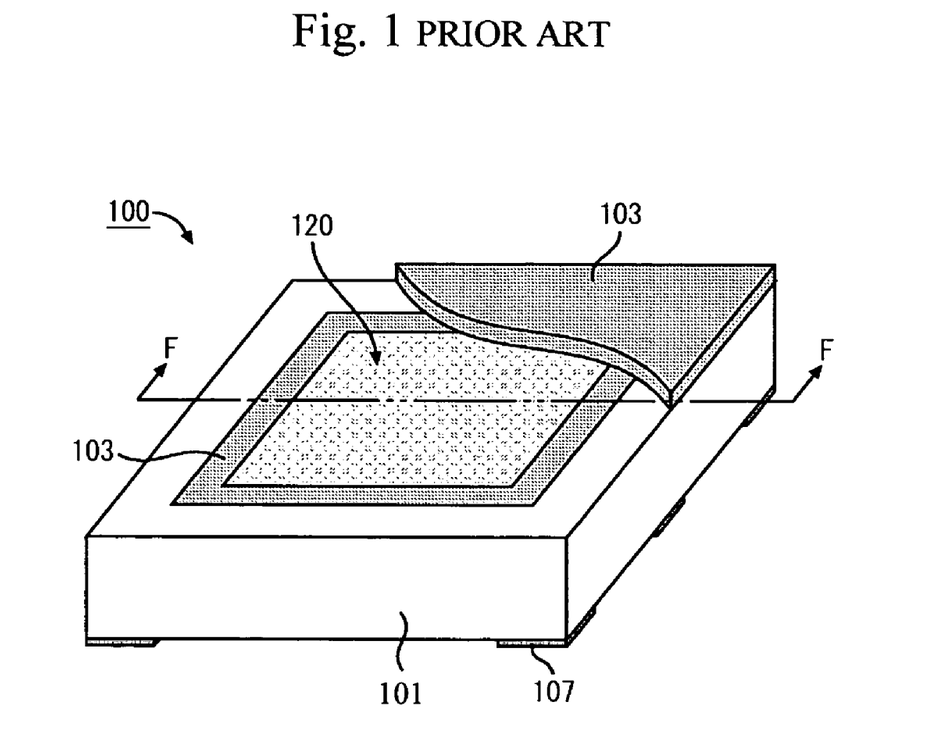
FIG. 1 is a perspective view of a conventional SAW device.
Figure 2:
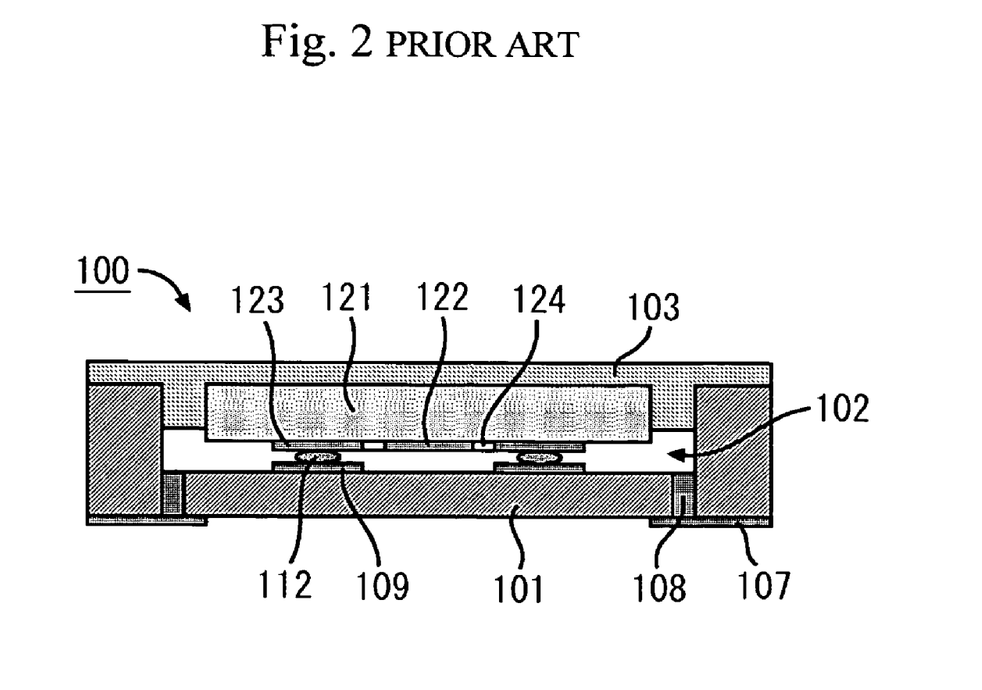
FIG. 2 is a sectional view taken along a line F-F.

A description will now be given of a conventional SAW device 100 with reference to FIGS. 1 and 2. FIG. 1 is a perspective view of the SAW device 100, and FIG. 2 is a sectional view taken along a line F-F shown in FIG. 1.

Referring to these figures, the SAW device 100 has a package 101 having a cavity 102 in which a SAW chip 120 is housed. Metal patterns, which include IDTs 122, interconnection lines 124, and electrode pads 123, are formed on a circuit-formed surface (main surface) of a piezoelectric substrate 121. The bottom surface of the cavity 102 (die-attached surface) is provided with metal patterns, which include electrode pads 109 aligned with the electrode pads 123 of the SAW chip 120. The SAW chip 120 is flip-chip bonded on the die-attached surface in the facedown state by using metal bumps 112. Thus, the package 101 and the SAW chip 120 can be electrically and mechanically connected to each other. The electrode pads on the die-attached surface are electrically connected to foot patterns 107 formed on the bottom surface of the package 101 (opposite to the surface defining the cavity 102) through interconnection lines and via interconnections 108. The cavity 102 is sealed with a resin 103.

However, the cavity 102 cannot be sealed with only the resin 103 with high reliability. The above sealing structure does not show good results in a test of measuring moisture resistance.

SUMMARY OF THE INVENTION

This is an object of the present invention to provide a surface acoustic wave device with improved moisture resistance and a method of fabricating such a device.

This object of the present invention is achieved by a surface acoustic wave device comprising: a package having a cavity; a SAW chip housed in the cavity; a resin sealing the cavity; and a metal thin film provided on the resin.

The above object of the present invention is also achieved by a method of fabricating a surface acoustic wave device comprising the steps of: (a) sealing a cavity of a package housing a surface acoustic wave chip with resin; and (b) providing a metal thin film on the resin.

The above object of the present invention is also achieved by a method of fabricating a surface acoustic wave device comprising the steps of: (a) bonding surface acoustic wave chips in cavities arranged in rows and columns on a base substrate; (b) sealing the cavities with resin; (c) notching the resin on boundaries along which the base substrate can be split into individual surface acoustic wave devices, so that packages each having one of the cavities can be partially exposed, notches in the resin having a width greater than a cutoff width in splitting; (d) providing a metal thin film on the resin and exposed portions of the packages; and (e) splitting the base substrate into the individual surface acoustic wave devices.

BRIEF DESCRIPTION OF THE DRAWINGS

Other objects, features and advantages of the present invention will become more apparent when read in conjunction with the accompanying drawings, in which.

DESCRIPTION OF THE PREFERRED EMBODIMENTS

A description will now be given of preferred embodiments of the present invention.

First Embodiment

Figure 3:
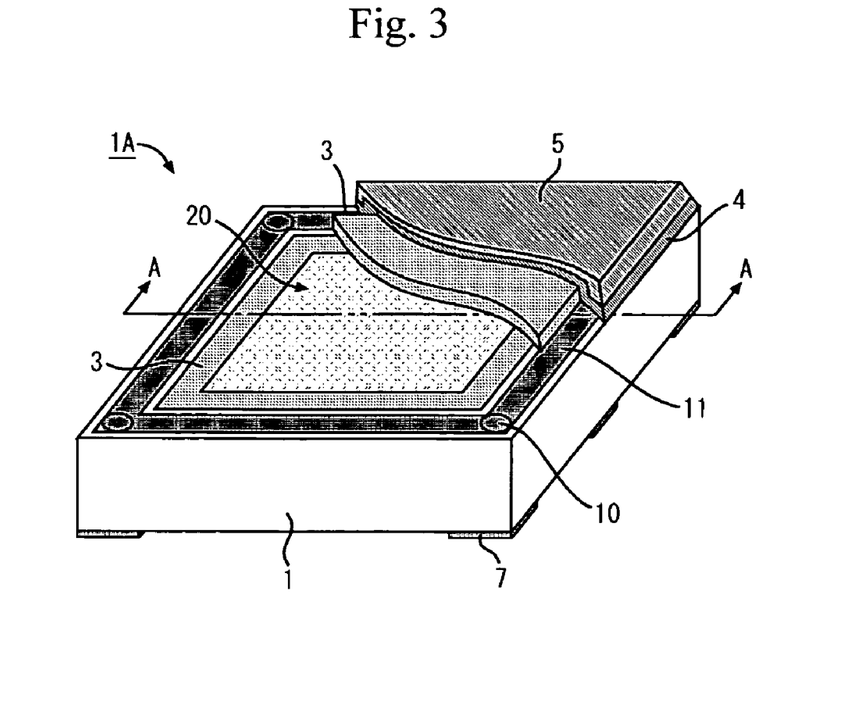
FIG. 3 is a perspective view of a SAW device according to a first embodiment of the present invention.
Figure 4A:
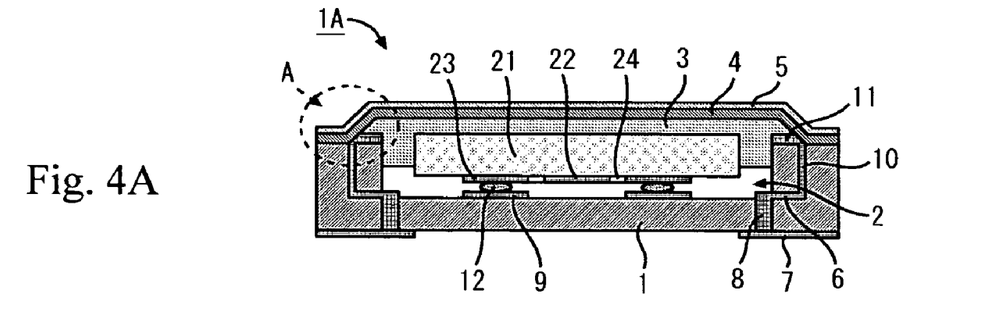
FIG. 4A is a sectional view taken along a line A-A shown in FIG. 3.
Figure 4B:
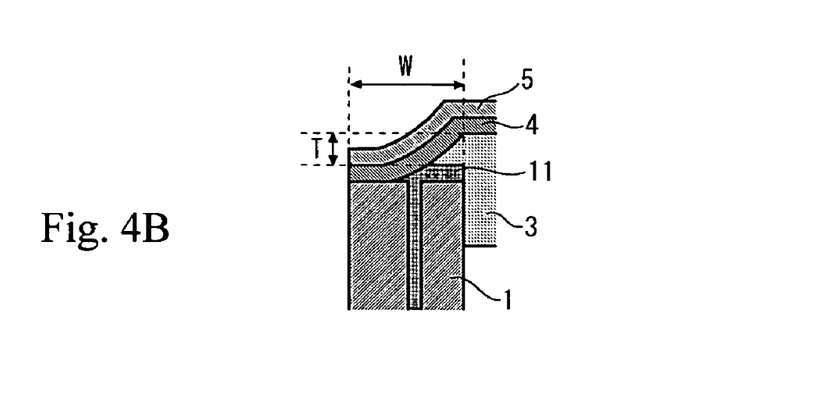
FIG. 4B is an enlarged view of a portion A shown in FIG. 4A.

FIGS. 3, 4A and 4B show a SAW device 1A according to a first embodiment of the present invention. More particularly, FIG. 3 is a perspective view of the SAW device 1A, FIG. 4A is a sectional view taken along a line A-A shown in FIG. 3, and FIG. 4B is an enlarged view of a portion A shown in FIG. 4A.

Referring to FIG. 3 and 4A, the SAW device 1A uses a package 1, which may be a ceramics substrate. A cavity 2, which is provided in the package 1, houses a SAW chip 20. In the present embodiment, the package 1 has a sidewall that is approximately 0.1 mm to 0.3 mm thick (0.2 mm for example), and a bottom plate having a thickness of 0.2 mm or less (for example, 0.15 mm). The cavity 2 has a depth capable of completely accommodating the SAW chip 20. In other words, the depth of the cavity 2 is greater than the height of the SAW chip 20. For example, when the SAW device 1A is 0.6 mm high and the SAW chip 20 is 0.35 mm high, the cavity 2 has a depth of approximately 0.4 mm. This arrangement makes it possible to completely accommodate the SAW chip 20 and prevent the SAW chip 20 from being damaged at the time of mounting on the print-circuit board.

Metal patterns, which include IDTs 22, interconnection lines 24 and electrode pads 23, are formed on the circuit-formed surface (main surface) of a piezoelectric substrate 21. The piezoelectric substrate 21 may be an LT substrate that is a piezoelectric single crystal of lithium tantalate, or an LN substrate that is a piezoelectric single crystal of lithium niobate. Another piezoelectric material such as crystalline quartz may be used for the substrate.

The metal patterns including the IDT 22, the interconnection lines 24 and the electrode pads 23 may be single layer structure or multilayer structure that contains, as the major component, a metal of aluminum (Al), copper (Cu), gold (Au), molybdenum (Mo), tungsten (W), tantalum (Ta), chromium (Cr), titanium (Ti), platinum (Pt), ruthenium (Ru) or rhodium (Rh). The metal patterns may be formed by photolithographic technology.

Metal patterns that include electrode pads 9 aligned with the electrode pads 23 of the SAW chip 20 and interconnection patterns integrally formed with the electrode pads 9 are formed on the bottom surface (die-attached surface) of the cavity 2. These metal patterns may be single layer structure or multilayer structure that contains, as the major component, a metal of Al, Cu, Au, Mo, W, Ta, Cr, Ti, Pt, Ru or Rh, and may be formed by printing and plating technology or formed by photolithographic technology.

The SAW chip 20 may be flip-chip bonded on the die-attached surface in the facedown state by using metal bumps 12 of gold or solder, so that the SAW chip 20 can be electrically and mechanically connected to the package 1.

The electrode pads 9 on the die-attached surface are electrically connected, via interconnection patterns 6 formed thereon, to via interconnection lines (which may be referred to as inner via patterns) that penetrate the bottom plate of the package 1. The via interconnection lines 8 are connected to foot patterns 7 formed on the back (bottom) surface of the package 1 opposite to the opening of the cavity 2. Input and output terminals and ground terminals of the SAW device chip 20 are extended to the foot patterns 7 on the bottom surface of the package 1 via the interconnection patterns 6 and the via interconnection lines 8.

The cavity 2 that accommodates the SAW chip 20 is sealed with a resin 3. The resin 3 does not reach the die-attached surface. In other words, it is preferable to define a space below the resin 3. This avoids a problem that the resin 3 reaches some metal patterns on the SAW chip 20 and prevents the normal filtering operation of the SAW device 1A. The resin 3 may be, for example, epoxy resin.

The resin that seals the cavity 2 is covered with a thin film 4, so that sealing can be improved. The resin coated with the metal thin film 4 does not directly receive external force at the time of mounting the SAW device 1A on the print-circuit board, so that the reliability in mounting can be improved. The metal thin film 4 is made of a metal material such as copper (Cu). The metal thin film 4 may have single-layer structure or multilayer structure having layers of different metals.

Exposed portions of the metal thin film 4 is plated or coated with an antioxidant film 5. Preferably, the antioxidant film 5 may be a metal-based film that contains, for example, nickel (Ni), gold (Au), platinum (Pt). The antioxidant film 5 may also be a resin-based film that is, for example, epoxy resin, acrylic resin or fluorinated resin such as Teflon (registered trademark). Besides, the antioxidant film 5 may be made of other materials resistant to oxidizing and corrosion.

As is shown in FIG. 4B, the metal thin film 4 contacts a metal pattern 11 formed on the upper ends of the sidewalls of the package 1. More specifically, the metal thin film 4 contacts the metal pattern 11 along outer edge portions of the package 1. The metal pattern 11 is electrically connected to the interconnection patterns 6 via the via interconnection lines 10 formed within the sidewalls of the package 1. Thus, the metal thin film 4 and the antioxidant film 5 are electrically connected to a corresponding foot pattern on the bottom surface of the package 1 (more specifically, a foot pattern connected to ground) via the metal pattern 11, via interconnection lines 10, the interconnection patterns 6 and the via interconnection lines 8.

As will be described in detail later, the metal thin film 4 and the metal pattern 11 can be electrically made by notching the resin 3 on the metal pattern 11 and growing the metal film 4 on exposed surfaces of the metal pattern 11 by electroplating. At that time, as shown in FIG. 4B, preferably, a ratio W/T is set equal to or greater than 0.05 where T is the notched depth of the resin 3 (depth up to the metal pattern 11) and W is half the width of the notch. It will be noted that the slope of the resin 3 shown in FIG. 3B is half of the notch on the resin 3 formed by notching in the fabrication process that will be described later. The ratio W/T indicates the degree of inclination of the slope on the surface of the resin 3. The forming of the slope having the degree of inclination equal to or less than 5% makes it possible to an underlying layer (which is another metal film 3a described later) below the metal thin film 4 from breaking away at the time of electroplating. For example, the depth T is equal to 0.02 mm, and the width W is equal to 0.2 mm. The slope cut deeply into the resin 3 may be flat or curved as shown in FIG. 4B.

The metal thin film 4 is joined directly to the metal pattern 11 or the sidewalls of the package, as shown in FIG. 4B. This results in perfect hermetic sealing of the cavity 2 with the package material and metal thin film, and thus improves the reliability of hermetic sealing. The antioxidant film 5 may be formed by growing nickel or the like by electroplating after the metal thin film 4 is formed by electroplating. This will be described in detail later.

Figure 5A:
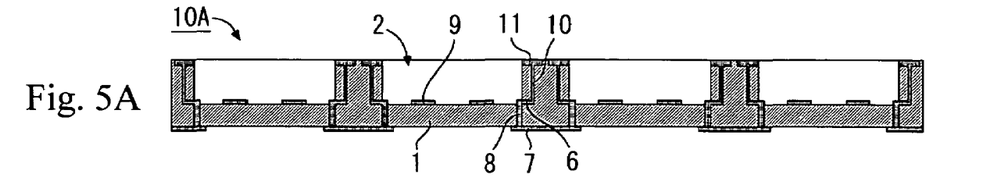
FIGS. 5A, 5B, 5C and 5D show a method of fabricating the SAW device according to the first embodiment of the present invention.
Figure 5B:
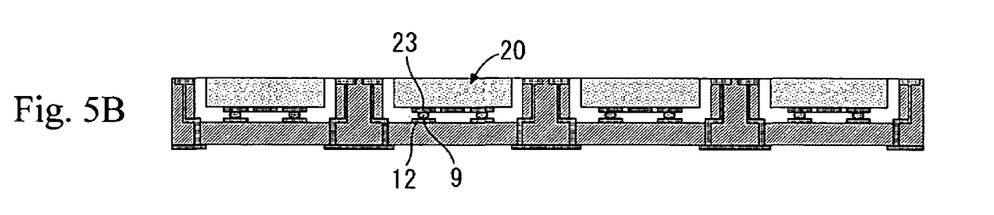

A description will now be given of a method of fabricating the SAW device 1A with reference to FIGS. 5A through 5D and 6A through 6D. As shown in FIG. 5A, a multi-package base substrate 10A is formed in which groups are arranged in rows and columns, each of which groups has the cavity 2, metal patterns including the metal pattern 11, the via interconnection lines 10, the electrode pads 9 and the interconnection patterns 6, the via interconnection lines 8, and the foot patterns 7. Next, the SAW chips 20 are flip-chip bonded in the cavities 2 in the facedown state, as shown in FIG. 5B. In the mounting on the print-circuit board, the electrode pads of the SAW chips 20 are aligned with the electrode pads 9 in the cavities 2, and are bonded thereto by metal bumps 12. Thus, the SAW chips 20 are electrically connected to the packages 1 and are mechanically fixed thereto.

Figure 5C:
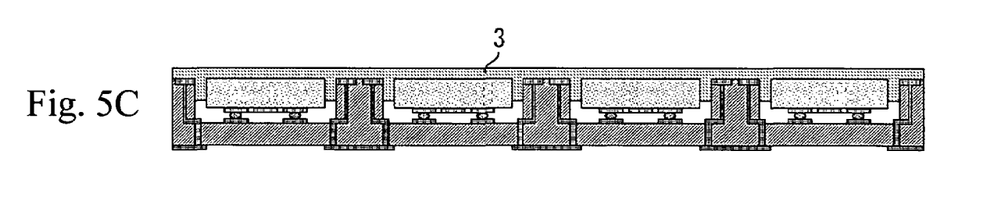
Figure 5D:
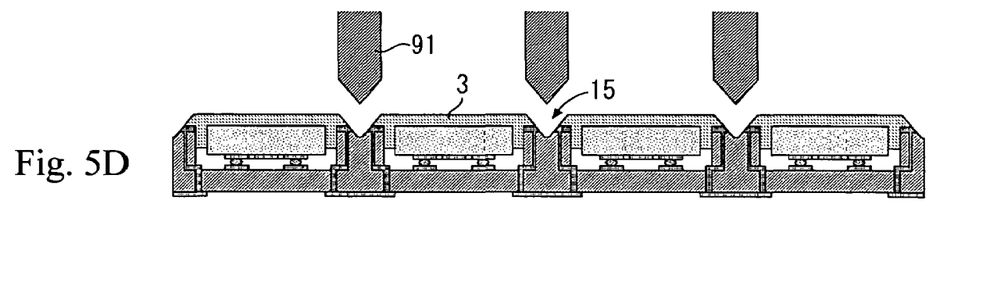

Then, as shown in FIG. 5C, the cavities 2 in which the SAW chips 20 have been bonded are sealed with the resin 3. Thereafter, a dicing blade 91 is used to form notches 15 on boundaries along which the base substrate should be split into individual packages, as shown in FIG. 5D. The resin 3 is cut in or notched so that the metal patterns 11 and the sidewalls of the packages 1 can be exposed. The dicing blade 91 has a blade capable of realizing the ratio W/T equal to or greater than 0.05 in which each of the notches 15 has a width equal to twice the width W that defines the ratio W/T. In other words, the relationship between the width W equal to half the width of each notch 15 and the depth T of the resin 3 up to the metal pattern 11 satisfies a ratio of 0.05 or greater. It can also be said that the step of FIG. 4D uses the blade 91 capable of realizing the degree of inclination of the slope equal to or less than 5%.

Figure 6A:
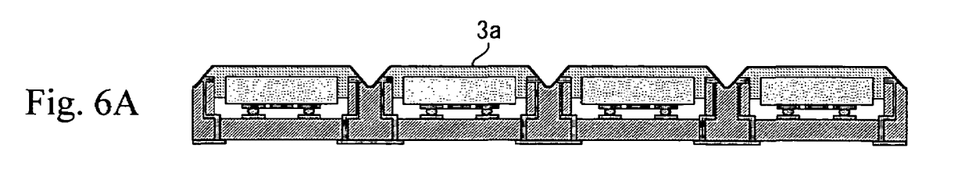
FIGS. 6A, 6B, 6C and 6D show a method of fabricating the SAW device according to the first embodiment of the present invention following the steps of FIGS. 5A through 5D.
Figure 6B:
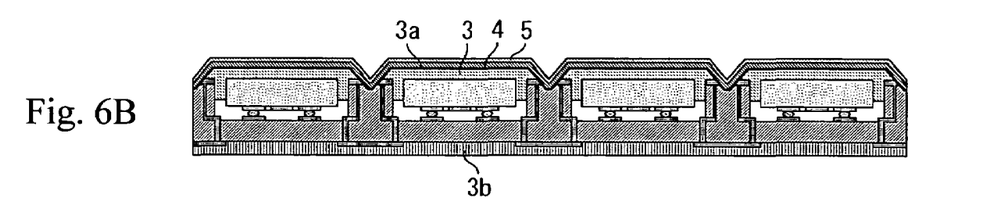

Next, the metal film 3a is deposited on the resin 3 and the notches 15 as a preprocess for electroplating, as shown in FIG. 6A. The presence of the notches 15 having the degree of inclination equal to or less than 5% avoids breaking away in deposition. After that, a resist 3b is provided on the back surface of the base substrate 10A (which corresponds to the back surfaces of the packages 1) in order to protect the foot patterns 7. Then, copper is grown on the upper surface of the base substrate 10A by electroplating, so that the metal thin film 4 can be formed on the metal film 3a, as shown in FIG. 6B. Further, nickel is provided on the metal thin film 4 by electroplating so that the antioxidant metal film 5 can be formed thereon, as shown in FIG. 6B. In the above-mentioned method, the reliability in hermetic sealing of the cavities 2 can be improved and the metal thin film 4 can be grounded by forming the notches 15 through which the metal pattern 11 or the package 1 are exposed and then providing the metal thin film 4 on the entire surface including the notches 15.

The above-mentioned process of forming the metal thin film 4 shown in FIG. 6B employs electroplating, which may be replaced by sputtering, vacuum deposition or a combination thereof. For example, in the combination of sputtering and electroplating, the metal thin film 3a is formed first by sputtering, and the metal thin film 4 is then formed thereon by electroplating. In the combination of vacuum deposition and electroplating, the metal thin film 3a is formed first by vacuum deposition, and the metal thin film 4 is then formed thereon by electroplating.

Figure 6C:
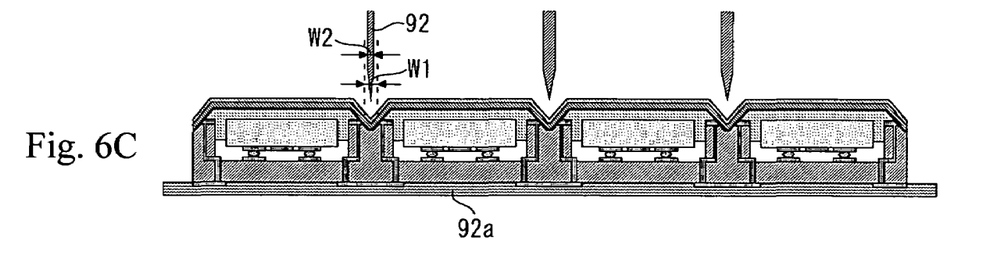
Figure 6D:
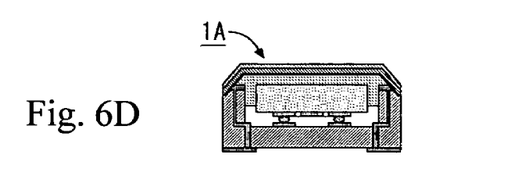

Thereafter, a dicing tape 92a is adhered to the back surface of the base substrate 10A, which is then split into the individual packages 1A by a dicing blade 92 applied to the base substrate 10A from the upper side thereof, as shown in FIG. 6C. Preferably, the dicing blade 92 has a width W2 narrower than a width W1 of the exposed portions of the packages 1. In other words, the notches 15 are 0.1 mm wider than the cutoff portions. This condition secures the joining of the metal thin film 4 and the packages 1. For example, the dicing blade 92 has the width W2 that is 0.1 mm narrower than the width W1 or more, so that the sufficient exposed portions of the packages 1 and the metal patterns 11 can be secured.

According to the first embodiment of the present invention, the reliability in hermetically sealing of the cavities 2 can be improved by forming the notches on the resin 3 provided to the openings of the cavities 2 of the packages 1 so as to expose the sidewalls of the packages 1 and forming the metal thin film 4 so as to be joined to the exposed sidewall portions. The reliability in mounting the SAW device 1A on the print-circuit board can be improved because the resin 3 is coated with the metal thin film 4 and is thus prevented from directly receiving external force. The metal thin film 4 is grounded by making contacts with the exposed portions of the metal patterns 11, so that the electrical characteristics of the SAW device 1A can be improved. The metal thin film 4 can be formed with high reliability by forming the notches 15 that are provided to expose the metal patterns 11 and the packages 1 and have the degree of inclination equal to or less than 5% with respect to the upper surface of the resin 3.

Second Embodiment

A description will now be given of a SAW device according to a second embodiment of the present invention. The second embodiment has a different way of making a connection between the metal pattern 11 formed on the upper surface of the package 1 and the interconnection lines 6 provided on the die-attached surface.

Figure 7:
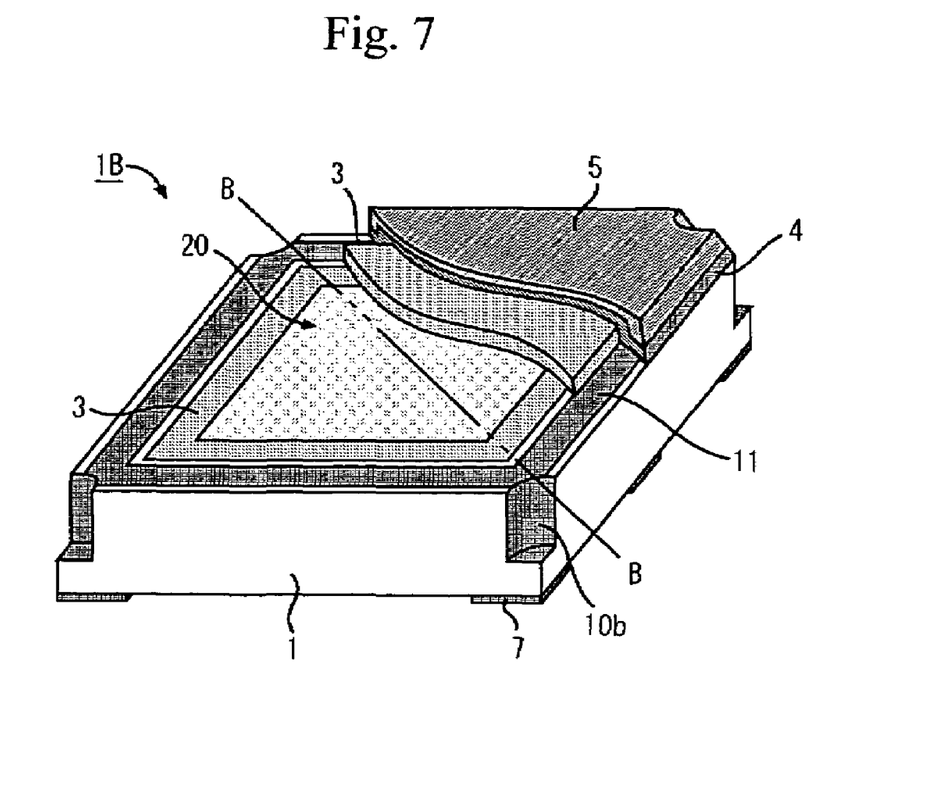
FIG. 7 is a perspective view of a SAW device according to a second embodiment of the present invention.
Figure 8:
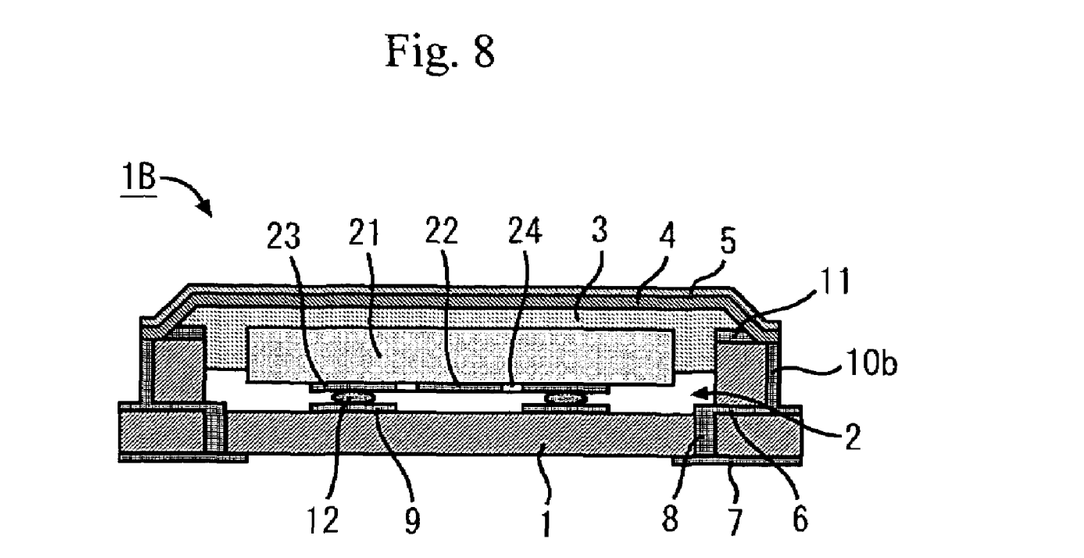
FIG. 8 is a cross-sectional view taken along a line B-B shown in FIG. 7.

FIGS. 7 and 8 show a SAW device 1B according to the second embodiment of the present invention. More particularly, FIG. 7 is a perspective view of the SAW device 1B, and FIG. 8 is a sectional view taken along a line B-B shown in FIG. 7. In these figures, parts that are the same as those shown in the previously described figures are given the same reference numerals. In the aforementioned first embodiment, the metal pattern 11 on the upper surfaces of the sidewalls of the package 1 are connected to the interconnection patterns 6 on the die-attached surface. According to the second embodiment, as shown in FIGS. 7 and 8, the metal pattern 11 is connected to the interconnection patterns 6 via castellations 10b plated with metal and formed on the outer surfaces of the package 1. The metal-plated castellations 10b shown in FIG. 7 are provided at the corners of the package 1. The metal-plated castellations 10b do not reach the bottom surface of the package 1. The metal-plated castellations 10b are used to make electrical connections between the metal thin film 4 and the foot patterns 7 (ground foot patterns) together with the interconnection lines 6 and the via interconnections 8. The other structures of the second embodiment are the same as those of the first embodiment. The SAW device 1B may be fabricated by the same method as that for the first embodiment.

According to the second embodiment of the present invention, the reliability in hermetically sealing of the cavities 2 can be improved by forming the notches 15 on the resin 3 provided to the openings of the cavities 2 of the packages 1 so as to expose the sidewalls of the packages 1 and forming the metal thin film 4 so as to be joined to the exposed sidewall portions. The reliability in mounting the SAW device 1B on the print-circuit board can be improved because the resin 3 is coated with the metal thin film 4 and is thus prevented from directly receiving external force. The metal thin film 4 is grounded by making contacts with the exposed portions of the metal patterns 11, so that the electrical characteristics of the SAW device 1A can be improved. The metal thin film 4 can be formed with high reliability by forming the notches 15 that are provided to expose the metal patterns 11 and the packages 1 and have the degree of inclination equal to or less than 5% with respect to the upper surface of the resin 3. The castellations 10b that do not reach the bottom surface of the package 1 can prevent the resin 3 that seals the cavity 2 from flowing out to the back surface of the package 1, particularly, the foot patterns 7.

Third Embodiment

A third embodiment of the present invention employs a different arrangement of the castellations 10c. More particularly, the castellations 10c used in the third embodiment are arranged on the inner walls of the package 1, and face the cavity 2. This arrangement will now be described with reference to FIGS. 9 and 10.

Figure 9:
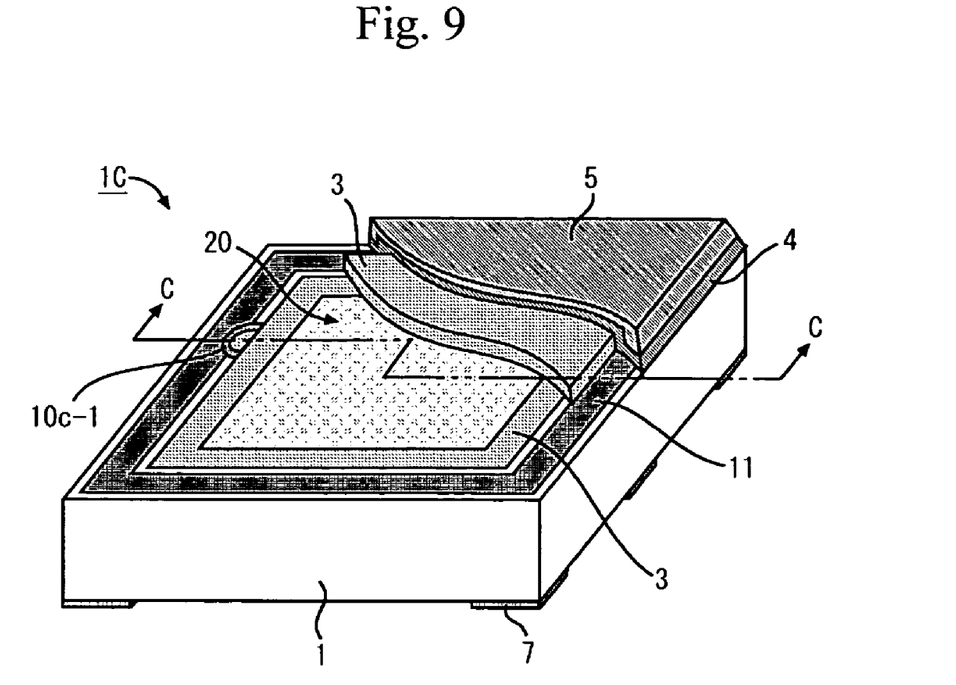
FIG. 9 is a perspective view of a SAW device according to a third embodiment of the present invention.
Figure 10:
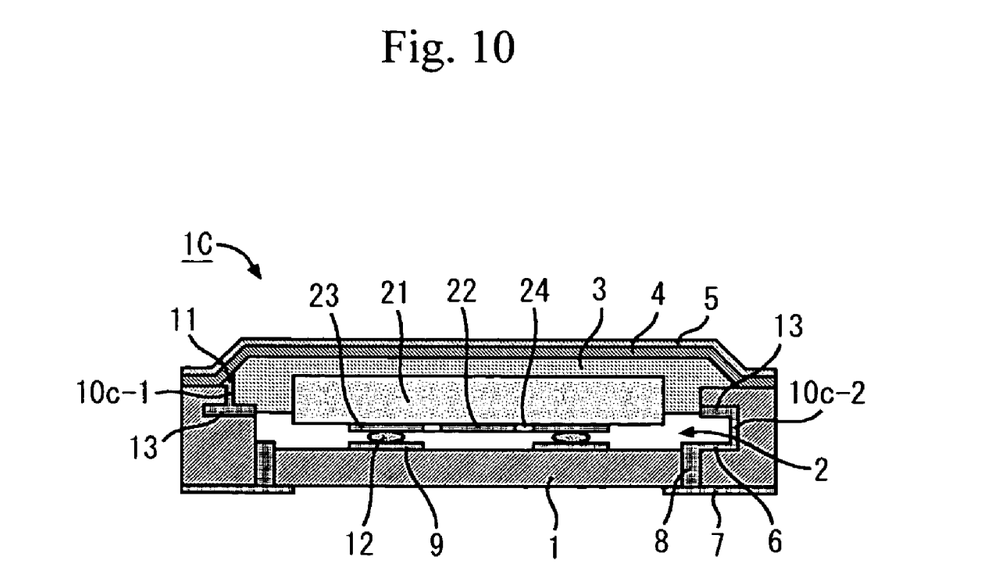
FIG. 10 is a sectional view taken along a line C-C shown in FIG. 9.

FIGS. 9 and 10 show a SAW device 1C according to the third embodiment. More particularly, FIG. 9 is a perspective view of the SAW device 1C, and FIG. 10 is a sectional view taken along a line C-C shown in FIG. 9. In these figures, parts that are the same as those shown in the previously described figures are given the same reference numerals.

Castellations 10c-1 and 10c-2 are formed on the inner walls of the package 1 that defines the cavity 2. The surfaces of the castellations 10c-1 and 10c-2 are plated with a metal. The castellations 10c-1 and 10c-2 are arranged at different levels in the vertical direction. The metal-plated castellations 10c-1 and 10c-2 are electrically connected to each other via interconnection patterns 13. The castellation 10c-1 at the upper level of the package 1 is electrically connected to the metal pattern 11 formed on the upper surfaces of the sidewalls of the package 1. The castellation 10c-2 at the lower level of the package 1 is electrically connected to the metal patterns 6 formed on the die-attached surface of the cavity 2. Thus, the metal pattern 11 is electrically connected to the foot patterns (particularly, the ground foot patterns) 7 formed on the backside of the package 1 via the castellation 10c-1, the interconnection patterns 13, the castellation 10c-2, the interconnection patterns 6 and the via interconnection lines 8. The other structures of the third embodiment are the same as those of the first embodiment, and a description thereof will be omitted here.

According to the third embodiment of the present invention, the reliability in sealing of the cavities 2 can be improved by forming the notches 15 on the resin 3 provided to the openings of the cavities 2 of the packages 1 so as to expose the sidewalls of the packages 1 and forming the metal thin film 4 so as to be joined to the exposed sidewall portions. The reliability in mounting the SAW device 1C on the print-circuit board can be improved because the resin 3 is coated with the metal thin film 4 and is thus prevented from directly receiving external force. The metal thin film 4 is grounded by making contacts with the exposed portions of the metal patterns 11, so that the electrical characteristics of the SAW device 1A can be improved. The metal thin film 4 can be formed with high reliability by forming the notches 15 that are provided to expose the metal patterns 11 and the packages 1 and have the degree of inclination equal to or less than 5% with respect to the upper surface of the resin 3. The castellations 10c-1 and 10c-2 provided on the inner walls of the package 1 and arranged at different levels in the vertical direction prevent the resin 3 that seals the cavity 2 from flowing out to the die-attached surface of the cavity 2 and the metal patterns of the SAW device 20.

The present invention is not limited to the specifically disclosed embodiments, and other embodiments, variations and modifications may be made without departing from the scope of the claimed invention.

The present invention is based on Japanese Patent Application No. 2003-193152 filed on Jul. 7, 2003, and the entire disclosure of which is hereby incorporated by reference.

What is claimed is:

1. A surface acoustic wave device comprising:
a package having a cavity;
a SAW chip housed in the cavity;
a resin sealing the SAW chip and not reaching a die-attached surface of the package;
a metal pattern provided on upper surfaces of sidewalls that define the cavity of the package; and
a metal thin film provided on the resin and electrically connected to the metal pattern on the upper surfaces of the sidewalls,
wherein the resin has a slope portion on which the metal thin film extends, and the metal thin film contacts the metal pattern at an edge of the slope portion.

2. The surface acoustic wave device as claimed in claim 1, wherein the SAW chip is flip-chip mounted on the die-attached surface, and wherein the resin does not reach an IDT on the SAW chip.

3. The surface acoustic wave device as claimed in claim 1, further comprising:
external terminals provided on a bottom of the package; and
interconnection lines electrically connecting the external terminals and the metal pattern.

4. The surface acoustic wave device as claimed in claim 3, wherein:
the package has via interconnection lines provided in sidewalls of the package that define the cavity; and
said interconnection lines include the via interconnection lines include.

5. The surface acoustic wave device as claimed in claim 3, wherein:
the package has metal-plated castellations provided on outer surfaces of the package; and
said interconnection lines include the metal-plated castellations.

6. The surface acoustic wave device as claimed in claim 3, wherein:
the package has metal-plated castellations provided on inner surfaces of the package; and
said interconnection lines include the metal-plated castellations.

7. The surface acoustic wave device as claimed in claim 1, wherein the metal thin film has multilayer structure.

8. The surface acoustic wave device as claimed in claim 1, wherein the metal thin film is plated or coated with a material that contains one of a metal and a resin.

9. The surface acoustic wave device as claimed in claim 1, further comprising a layer provided on the metal thin film, wherein the layer contains any of nickel, gold, platinum, epoxy resin, acrylic resin and fluorinated resin.

10. The surface acoustic wave device as claimed in claim 1, wherein:
a ratio W/T is equal to or greater than 0.05 where W is half a width of a notch defining the slope and T is a depth of the notch.

* * * * *